US006940328B2

(12) United States Patent
Lin

(10) Patent No.: US 6,940,328 B2
(45) Date of Patent: Sep. 6, 2005

(54) METHODS AND APPARATUS FOR DUTY CYCLE CONTROL

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/229,790

(22) Filed: Aug. 28, 2002

(65) Prior Publication Data

US 2004/0041609 A1 Mar. 4, 2004

(51) Int. Cl.[7] ........................... H03K 3/017; H03K 5/04
(52) U.S. Cl. ....................................... 327/175; 327/172
(58) Field of Search ................................. 327/172–175

(56) References Cited

U.S. PATENT DOCUMENTS

| | | | | |
|---|---|---|---|---|
| 5,614,855 A | | 3/1997 | Lee et al. | 327/158 |
| 5,907,254 A | * | 5/1999 | Chang | 327/165 |
| 6,111,446 A | * | 8/2000 | Keeth | 327/258 |
| 6,198,322 B1 | * | 3/2001 | Yoshimura | 327/175 |
| 6,456,133 B1 | * | 9/2002 | Nair et al. | 327/175 |
| 6,535,040 B2 | * | 3/2003 | Jung et al. | 327/175 |

OTHER PUBLICATIONS

Article entitled "An All–Analog Multiphase Delay–Locked Loop Using a Replica Delay Line for Wide–Range Operation and Low–Jitter Performance" by Yongsam Moon, Jongsang Choi, Kyeongho Lee, Deog–Kyoon Jeong and Min–Kyu Kim, IEEE Journal of Solid–State Circuits, vol. 35, No. 3, Mar. 2000.

Article entitled "Two Novel Fully Complementary Self–Biased CMOS Differential Amplifiers" by Mel Bazes, IEEE Journal of Solid–State Circuits, vol. 26, No. 2, Feb. 1991.

Portion of article entitled "Dual–Loop Delay–Locked Loop" by Jung, et al., IEEE Journal of Solid–State Circuits, vol. 36, No. 5, May 2001, pp. 788–789.

* cited by examiner

*Primary Examiner*—Dinh T. Le
(74) *Attorney, Agent, or Firm*—Snell & Wilmer LLP

(57) ABSTRACT

An electronic system according to various aspects of the present invention comprises a signal generator configured to generate a first signal and a duty cycle correction circuit configured to be responsive to the first signal and provide a corrected signal having a corrected duty cycle. The duty cycle correction circuit may include a duty cycle detection circuit and a signal adjustment circuit. The duty cycle detection circuit is suitably configured to identify a disparity between a corrected duty cycle of the corrected signal and a target duty cycle. In one embodiment, the duty cycle detection circuit includes a self-bias circuit configured to generate a control signal according to the disparity between the corrected duty cycle and the target duty cycle. The signal adjustment circuit may be responsive to the control signal and configured to provide the corrected signal having the corrected duty cycle according to the control signal.

20 Claims, 8 Drawing Sheets

METHODS AND APPARATUS FOR DUTY CYCLE CONTROL

FIELD OF THE INVENTION

The present invention generally relates to electronic circuits.

BACKGROUND OF THE INVENTION

Many high-speed electronic systems utilize both the rising and falling edges of a clock signal to double the speed of the system without doubling the clock rate. In such systems, the proper duty cycle of the clock signal is critical, for example to latch data at the appropriate time. The duty cycle may be distorted, however, due to variations in signal propagation paths and other factors. Thus, an intended 50% duty cycle may become skewed in operation, which may disrupt the proper operation of the system.

Many systems include a duty cycle correction circuit to maintain the desired duty cycle. Referring to FIG. 8, a conventional duty cycle corrector comprises three stages. Typically, a duty cycle detector 710 uses a capacitor to convert the duty cycle information into an analog signal having a magnitude proportional to the duty cycle difference. The difference is amplified or compared to a constant reference voltage by an amplifier or comparator 712 to generate an adjustment signal to adjust the duty cycle. The adjustment signal is used by an adjustment circuit 714 to adjust the duty cycle of the signal so that the desired duty cycle is attained. Such systems, however, require maintenance of the reference voltage at a constant level, which may be difficult or impossible to maintain. Further, such circuits require time to settle to the proper duty cycle, and may be sensitive to noise as well.

SUMMARY OF THE INVENTION

An electronic system according to various aspects of the present invention comprises a signal generator and a duty cycle correction circuit configured to be responsive to the signal generator and provide a corrected signal having a corrected duty cycle. The duty cycle correction circuit may include a duty cycle detection circuit and a signal adjustment circuit. The duty cycle detection circuit is suitably configured to identify a disparity between a corrected duty cycle of the corrected signal and a target duty cycle. In one embodiment, the duty cycle detection circuit includes a self-bias circuit configured to generate a control signal according to the disparity between the corrected duty cycle and the target duty cycle. The signal adjustment circuit may be responsive to the control signal and configured to provide the corrected signal having the corrected duty cycle according to the control signal.

BRIEF DESCRIPTION OF THE DRAWING

Aspects of the present invention are disclosed in the non-limiting embodiments described in the specification and the claims, in conjunction with the accompanying figures, wherein like numerals designate like elements:

Elements in the figures are illustrated for simplicity and clarity and have not necessarily been drawn to scale. For example, the dimensions of some of the elements in the figures may be exaggerated relative to other elements to improve understanding of the embodiments of the present invention.

DETAILED DESCRIPTION OF EXEMPLARY EMBODIMENTS

Various aspects and features of the present invention may be described in terms of functional components and steps. Such functional components and steps may be realized by any number of elements and/or steps configured to perform the specified functions. For example, the present methods and apparatus may employ electronic, signaling, and logic elements, like capacitors, resistances, transistors, buffers, operational amplifiers, and voltage supplies, that may carry out a variety of functions in various embodiments, applications, and environments. In addition, the present methods and apparatus may be practiced in conjunction with any number of procedures and systems, and the apparatus and methods described are merely exemplary applications for the invention. Further, the methods and apparatus may employ any appropriate techniques, conventional or otherwise, for placement, use, manufacturing, and the like.

Figure 1:
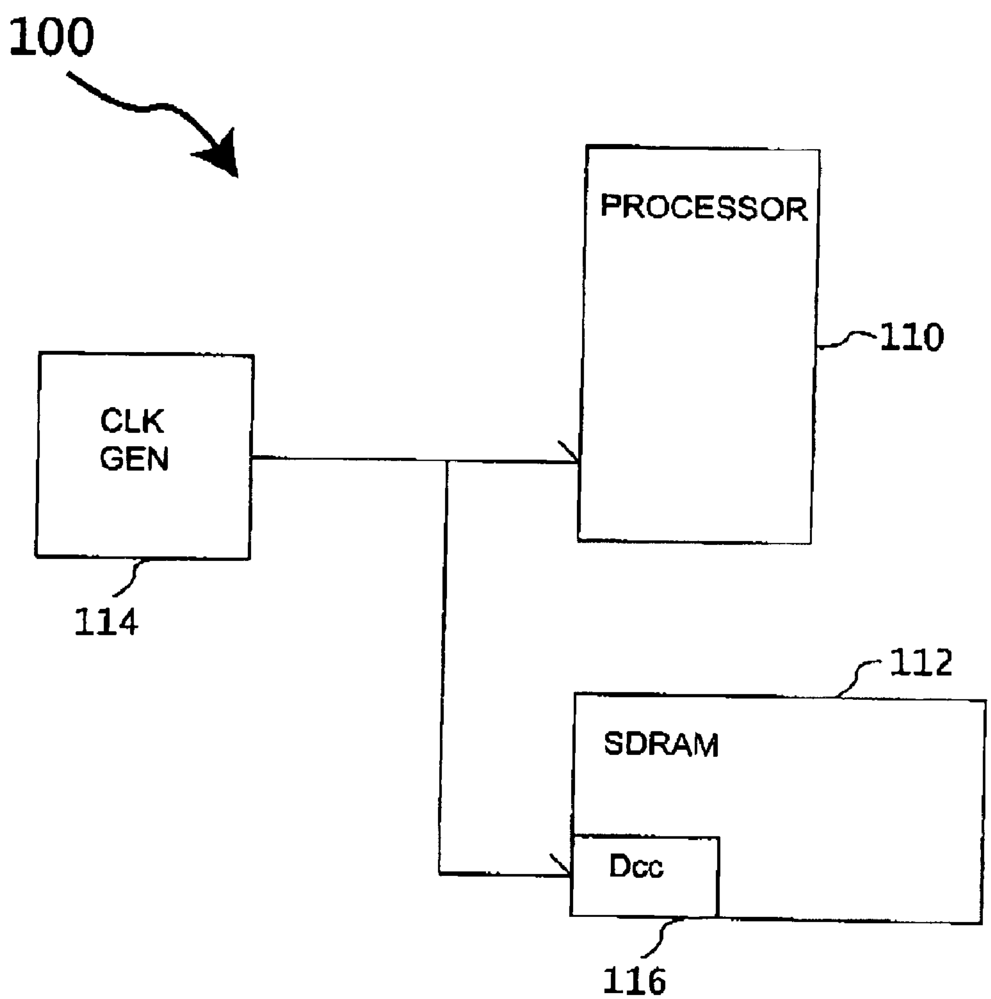
FIG. 1 is a block diagram of an electronic system according to various aspects of the present invention.

An electronic system according to various aspects of the present invention includes a plurality of components operating in conjunction with a duty cycle correction (DCC) circuit. The components may comprise any components using a DCC circuit, such as multiple integrated circuits and electrical components on a single board, various elements in a single integrated circuit, various components of a computer system, or any other components. For example, referring to FIG. 1, an exemplary electronic system 100 suitably comprises a processor 110, a memory system 112, and a clock circuit 114. The processor 110 controls the electronic system 100 in accordance with a program. The processor 110 may comprise, for example, a conventional central processing unit, such as an Intel Pentium processor or an Advanced Micro Devices Athlon processor. The clock circuit 114 generates a system clock signal and provides the system clock signal to various components of the electronic system 100, such as the processor 110 and the memory system 112. The clock circuit 114 may comprise any system configured to generate a signal, such as a conventional timing device using a quartz crystal.

The memory system 112 stores information for subsequent retrieval. The memory system 112 may comprise any appropriate memory, memory system, or storage device or system. For example, the memory system 112 may comprise a memory subsystem including a memory controller, multiple memory chips, and associated logic and circuitry. In the present embodiment, the memory system 112 comprises an SDRAM, such as a DDR SDRAM available from Micron Technology, Inc.

The memory system 112 suitably includes a memory circuit, having one or more data storage circuits, and a duty cycle correction (DCC) circuit 116. The DCC circuit 116 is configured to be responsive to a signal and provide a corrected signal. In the present embodiment, the DCC circuit 116 is configured to adjust the duty cycle of an incoming signal, such as the clock signal from the clock circuit 114, and provide a corrected signal having a corrected duty cycle to more closely approximate or match a target duty cycle. The DCC circuit 116 is suitably self-biasing to maintain the target duty cycle.

Figure 2:
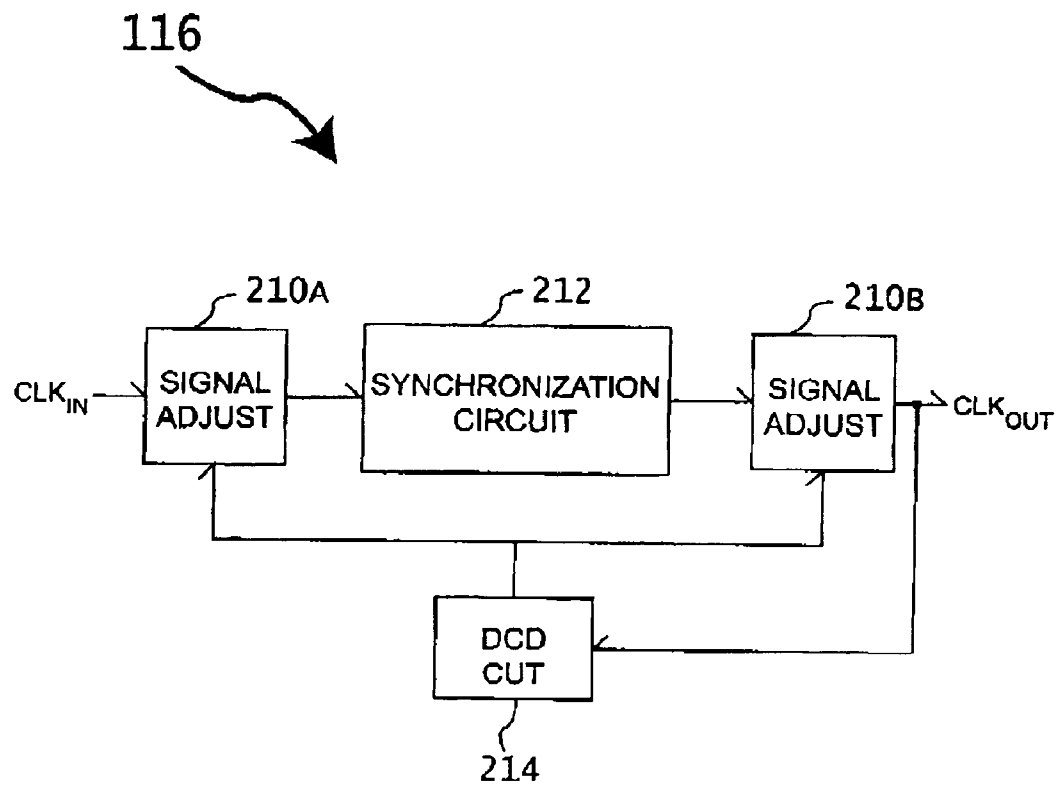
FIG. 2 is a block diagram of an exemplary duty cycle correction circuit.

The DCC circuit 116 may be configured in any suitable manner to achieve or approach the target duty cycle. For example, referring to FIG. 2, a DCC circuit 116 according to various aspects of the present invention comprises at least one signal adjustment circuit 210A, B; and a duty cycle detection (DCD) circuit 214. The DCD circuit 214 identifies deviation of a signal's actual duty cycle from a target duty cycle. The DCD circuit 214 suitably controls the signal adjustment circuit 210A, B, which adjusts the clock signal duty cycle according to the signals from the DCD circuit 214. In the present embodiment, the DCC circuit 116 further comprises a synchronization circuit 212. The synchronization circuit 212 is responsive to an incoming signal, for example from the first signal adjustment circuit 210A, and is configured to provide a delayed signal synchronized to the incoming signal.

The signal adjustment circuit 210 adjusts the duty cycle of the external signal. The external signal is suitably adjusted by the signal adjustment circuit 210 before transmission to the synchronization circuit 212, after processing by the synchronization circuit 212, or both. Adjusting the external signal both before and after the synchronization circuit 212 tends to improve the adjustment range available to the signal adjustment circuit 210. Further, providing signal adjustment before processing by the synchronization circuit 212 may improve the precision of the overall adjustment over a configuration having only one signal adjustment. Adjustment of the signal may be performed, however, any number of times and at any desired stage in the signal path.

Figure 3:
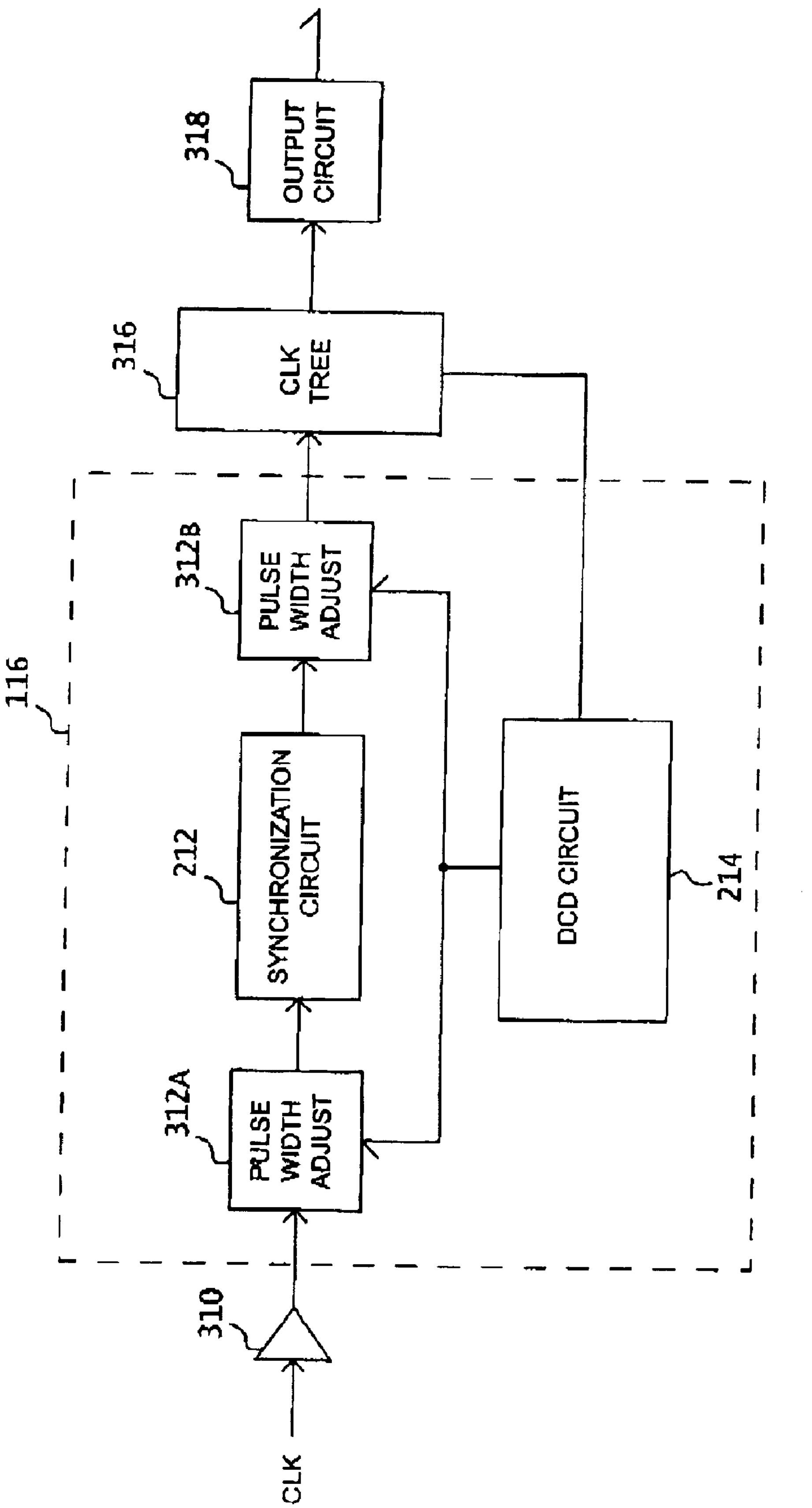
FIG. 3 is a block diagram of an exemplary duty cycle correction circuit.

The signal adjustment circuit may be configured in any suitable manner to adjust the incoming signal, for example to adjust the duty cycle. Referring to FIG. 3, the signal adjustment circuit 210 of the present embodiment comprises two pulse width adjustment (PWA) circuits 312A, B. An exemplary DCC circuit 116 receives an external signal, such as the clock signal, via an input buffer 310. The first PWA circuit 312A is responsive to the external signal, for example via the buffer 310, and provides an initially adjusted signal to the synchronization circuit 212. The second PWA circuit 312B is suitably responsive to a signal, such as the initially adjusted signal In the present embodiment, the second PWA circuit 312B adjusts a synchronized signal from the synchronization circuit 212 to provide the corrected signal. Each of the PWA circuits 312A, B may adjust the signals according to control signals from the DCD circuit 214.

Figure 4:
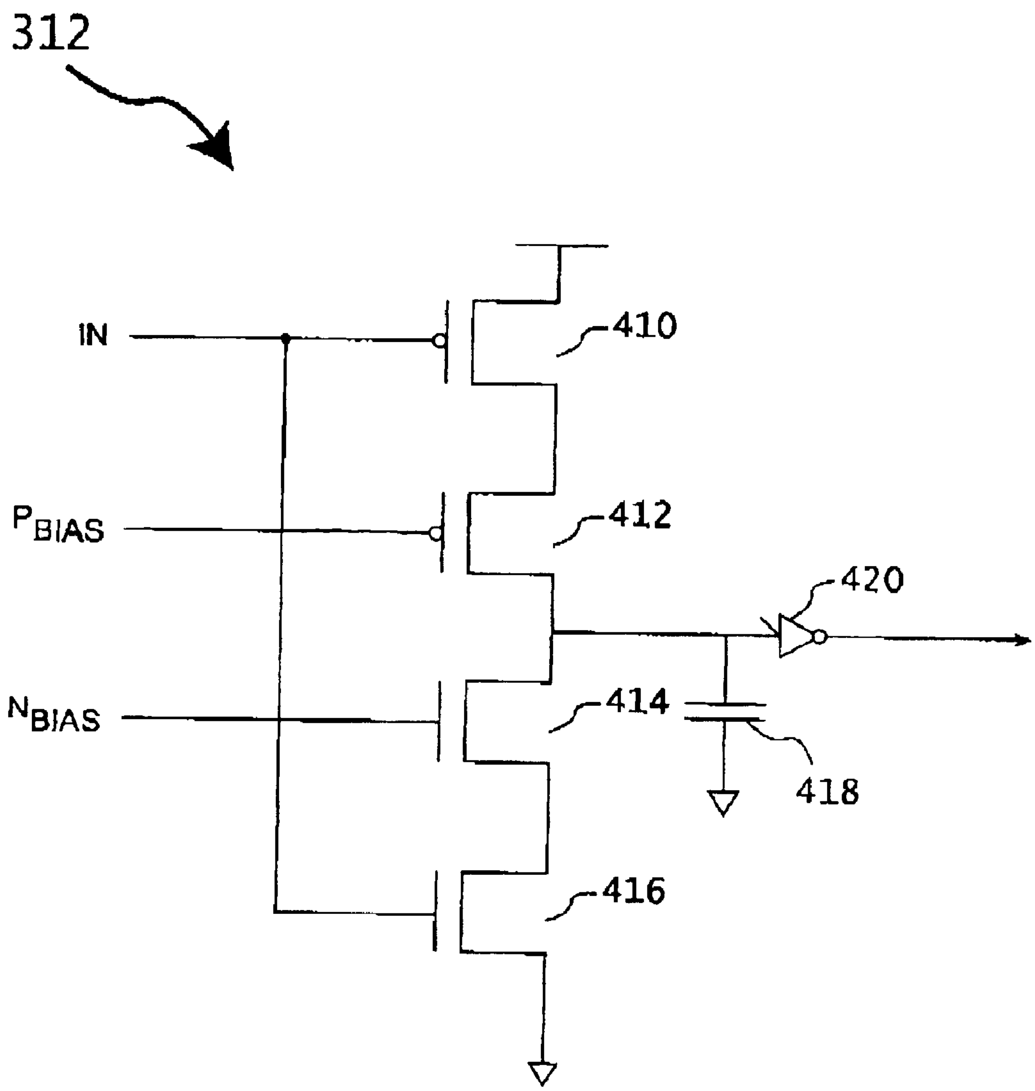
FIG. 4 is a schematic diagram of an exemplary pulse width adjustment circuit.

The PWA circuits 312A, B may be configured in any suitable manner to adjust the duty cycle of the signal according to the control signals received from the DCD circuit 214. The PWA circuits 312A, B may comprise any suitable circuits or systems for adjusting the duration of the positive and negative pulses, and thus the duty cycle, of the clock signal. In the present embodiment, the PWA circuits 312A, B are configured to adjust the duty cycle by adjusting the current charged to or discharged from a capacitor. For example, referring to FIG. 4, a PWA circuit 312 according to various aspects of the present invention comprises multiple transistors, such as a series of two p-channel MOSFETs 410, 412 and two n-channel MOSFETs 414, 416. The gates of the first and fourth transistors 410, 416 are connected to the clock signal, and the gates of the second and third transistors 412, 414 are connected to bias signals, respectively, received from the DCD circuit 214. A terminal of the first transistor 410 is connected to a power source, such as $V_{CC}$. A terminal of the fourth transistor 416 is connected to another potential, such as ground or $V_{SS}$. The output of the PWA circuit 312 is provided by the node between the second and third transistors 412, 414, for example via an inverter circuit 420.

By controlling the bias signals, the duty cycle of the clock signal may be controlled. For example, in the present embodiment, the output signal is provided to a capacitor 418. If the two bias transistors 412, 414 are turned on, the output signal at the inverter output corresponds to the clock signal. By adjusting the bias signals, the bias transistors 412, 414 operate as switches to selectively open and close a current path to charge and discharge the capacitor 418. By controlling the current to the capacitor, the time required to reach the higher ($V_{CC}$) and lower (ground or $V_{SS}$) voltage levels may be changed, which changes the duty cycle of the signal accordingly.

Referring again to FIGS. 2 and 3, the synchronization circuit 212 is configured to receive a reference signal and generate a synchronized signal according to the reference signal. The synchronization circuit 212 suitably generates the output signal at the same frequency as the reference signal following a selected delay. The synchronization circuit 212 may be configured, however, in any suitable manner. In the present embodiment, the synchronization circuit 212 is configured to generate a synchronized signal according to the initially adjusted clock signal. The synchronization circuit 212 may comprise any system for generating a synchronized signal according to the incoming clock signal, such as a phase-locked loop circuit, a delay-locked loop circuit, or a synchronous mirror delay circuit. If no synchronization is required in the particular system, the synchronization circuit 212 may be alternately configured, for example as a buffer, or omitted altogether.

The DCD circuit 214 is configured to control the PWA circuits 312A, B to maintain a desired duty cycle in the clock signal. The DCD circuit 214 may comprise any suitable circuit for identifying a difference between the actual duty cycle of a signal and a target duty cycle, such as a feedback circuit configured to identify an incorrect duty cycle in the clock signal and generate a corresponding control signal. For example, in the present embodiment, the DCD circuit 214 monitors the adjusted clock signal and generates control signals to control the PWA circuits 312A, B. The electronic system 100 may include one or more DCD circuits 214, each of which may control one or more other components, including the PWA circuits 312A, B.

Figure 5:
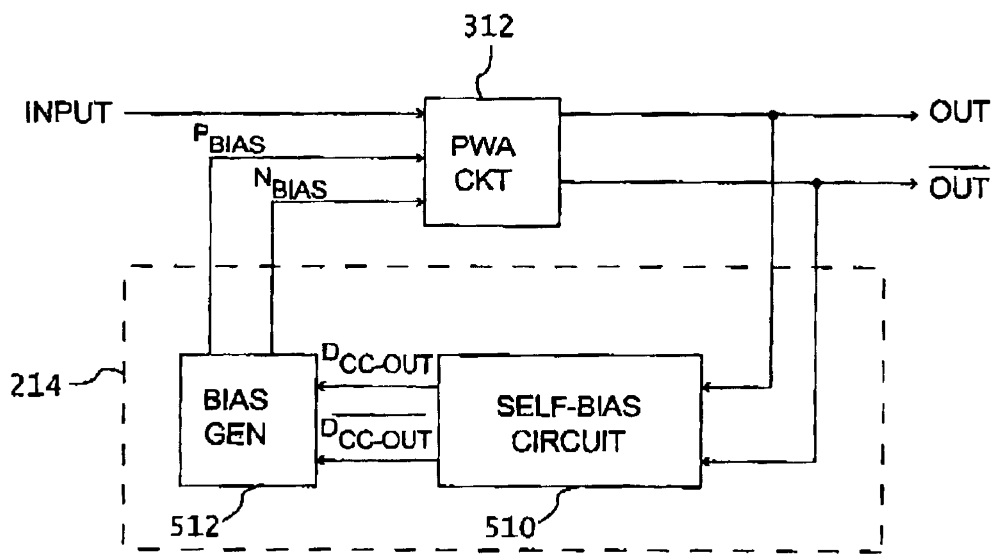
FIG. 5 is a block diagram of an exemplary duty cycle detection circuit and a pulse width adjustment circuit.

Referring to FIG. 5, an exemplary DCD circuit 214 suitably comprises a self-bias circuit 510 and a bias generator 512. The self-bias circuit 510 is configured to monitor the adjusted clock signal and generate a control signal corresponding to a duty cycle error detected in the adjusted clock signal compared to a target duty cycle. The bias generator 512 receives the control signals from the self-bias circuit 510 and provides corresponding bias signals to the PWA circuits 312.

Figure 6:
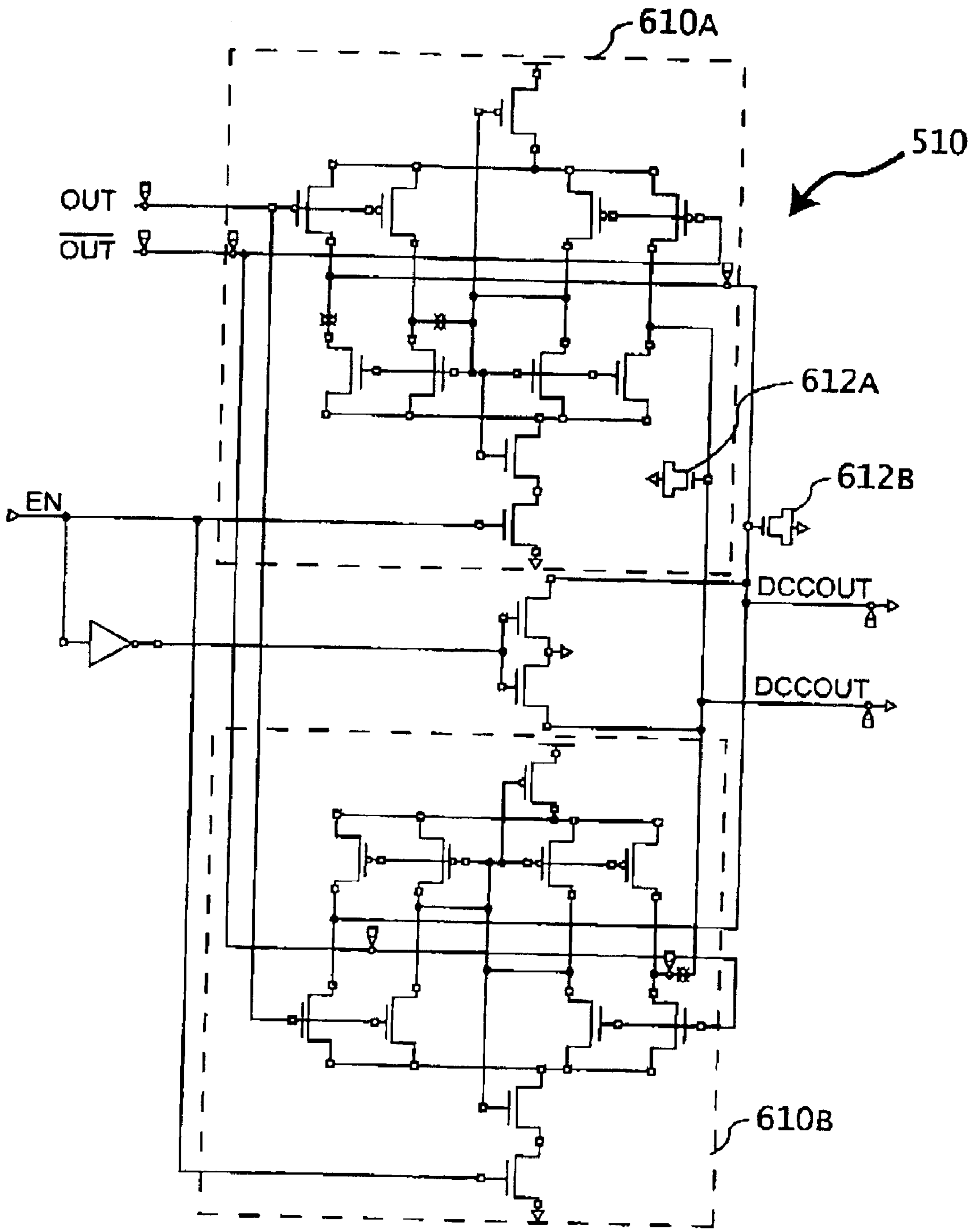
FIG. 6 is a schematic diagram of an exemplary self-biasing, complementary differential buffer.

The self-bias circuit 510 may comprise any suitable self-bias circuit. Various self-bias circuits are described in, for example, an article entitled "Two Novel Fully Complementary Self-Biased CMOS Differential Amplifiers", by Mel Bazes, IEEE Journal of Solid-State Circuits, Vol. 26, No. 2, February 1991, pp. 165–8. Referring to FIG. 6, a suitable self-bias circuit 510 comprises one or more self-bias differential buffers 610. In the present embodiment, the self-bias circuit 510 comprises two amplifiers, such as self-bias differential buffers 610A, B, which may exhibit improved common input characteristics.

By using a self-bias differential buffer, additional circuitry for generating a constant bias reference voltage may be omitted. The self-bias differential buffers 610A, B are suitably in a fully complementary configuration and self-biased through negative feedback. Such self-bias differential buffers exhibit relatively low sensitivity of active-region biasing to variations in, for example, processing, temperature, and supply. Further, self-bias differential buffers offer relatively quick recovery and low power requirements. The self-bias differential buffers 610A, B of the present embodiment are adapted for low voltage operation, for example using voltages of 1.5 volts or less.

The first differential buffer 610A receives the supplementally adjusted signal from the second PWA circuit 312A, and the second differential buffer 610B receives the complement (phase-shifted 180 degrees) to the supplementally adjusted signal. The self-bias differential buffers 610A, B vary the charge applied to a pair of capacitors 612A, B according to the magnitude of the difference in the logic high and logic low portions of the input signals, which corresponds to the magnitude of the duty cycle error. The charge magnitudes on the capacitors 612A, B provide the control signals to be transmitted to the bias generator 512. For 50% duty cycle inputs, the DC difference between the control signals provided by the capacitors is close to zero.

The bias generator 512 is suitably configured to provide bias signals to the PWA circuits according to the control signals from the self-bias circuit 510. The bias generator 512 suitably receives the control signals from the self-bias circuit 510 and adjusts at least one bias signal accordingly. For example, referring again to FIG. 5, the bias generator 512 generates the bias signals $P_{BIAS}$ and $N_{BIAS}$ in response to the first and second control signals.

Figure 7:
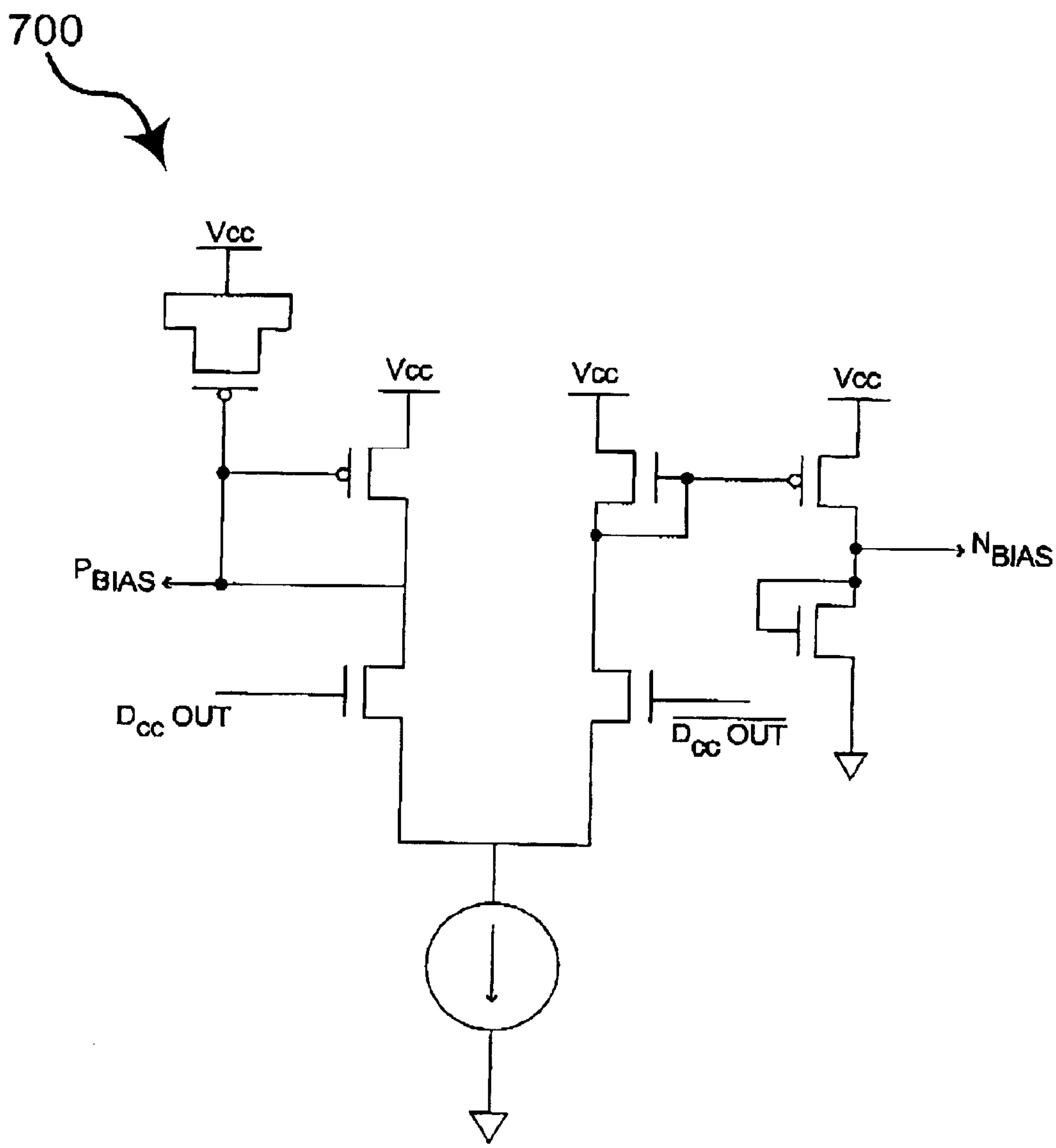
FIG. 7 is a schematic diagram of an exemplary bias signal generator.
Figure 8:
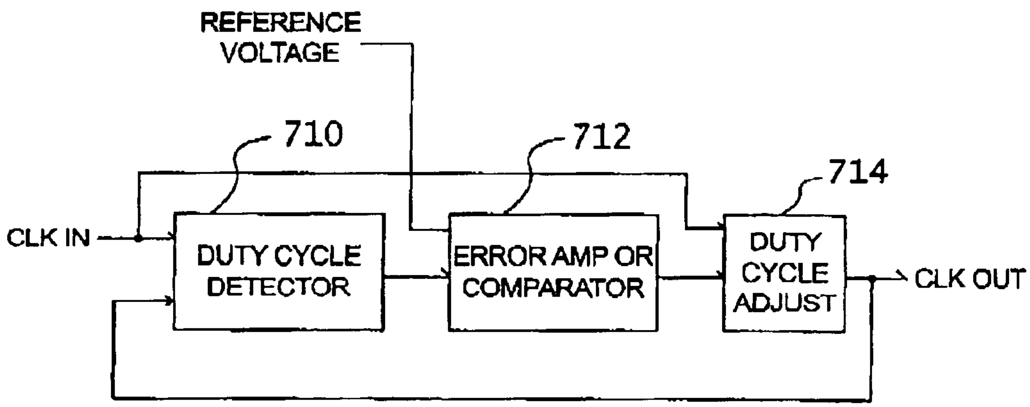
FIG. 8 is a block diagram of a prior art duty cycle correction circuit.

The bias generator 512 may comprise any suitable system for controlling the PWA circuits 312A, B according to the control signals. For example, in the present embodiment, the bias generator 512 comprises a circuit configured to convert the time-based control signals received from the self-bias differential buffers 610A, B to magnitude-based bias signals for controlling the PWA circuits 312A, B. Referring to FIG. 7, an exemplary bias generator suitably comprises a bias differential amplifier 700 configured to generate the bias control signals in response to the control signals from the self-bias circuit 510. The bias differential amplifier 700 is configured to generate the bias signals $P_{BIAS}$ and $N_{BIAS}$ in response to the first and second control signals. The magnitudes of the bias signals $P_{BIAS}$ and $N_{BIAS}$ correspond to the magnitude of the duty cycle error designated by the control signals. Thus, the bias generator 512 converts the control signals to a form that may be used to control the PWA circuits 312A, B. In other configurations using different signal adjustment methods, the bias generator 512 may be reconfigured accordingly or, if appropriate, omitted altogether.

The adjusted signal from the second PWA circuit 312B may be used in any appropriate manner. For example, in the present embodiment, the adjusted signal is provided to a set of buffers or a clock tree 316 (see FIG. 3) that generates multiple signals based on the adjusted signal. An output circuit 318 (see FIG. 3) is also configured to receive the adjusted clock signal, for example from the clock tree 316. The output circuit 318 may comprise any suitable system for receiving the adjusted clock signal, such as a buffer for receiving data, a latch for latching data, an amplifier, a driver circuit, or any other appropriate circuit or system.

In operation, the external signal is transmitted by the buffer 310 to the first PWA circuit 312A. The first PWA circuit 312A generates the initially adjusted signal having a selected period by adjusting the magnitude of the signal provided to the capacitor 418. The initially adjusted signal is received by the synchronization circuit 212, which generates a synchronized signal according to the initially adjusted signal. In particular, the synchronized signal has a frequency and duty cycle substantially corresponding to the initially adjusted signal. The synchronized signal is received by the second PWA circuit 312B, which supplementally adjusts the duty cycle of the synchronized signal according to the control signal from the DCD circuit 214. The supplementally adjusted, corrected signal may be propagated to other components of the electronic system 100.

The corrected signal is also provided, for example either directly or via the clock tree 316, to the DCD circuit 214. The corrected signal is received at the self-bias circuit 510, which adjusts the charge provided to the capacitors 612A, B according to any difference between the corrected duty cycle and the target duty cycle. The control signals from the capacitors 612A, B are provided to the bias generator 512, which generates the bias signals to control the PWA circuits 312A, B.

The present invention is described with reference to various preferred embodiments. However, changes and modifications may be made to various exemplary embodiments without departing from the scope of the present invention. These and other changes or modifications are intended to be included within the scope of the present invention as set forth in the appended claims.

What is claimed is:

1. A memory system, comprising:

a memory; and a duty cycle correction circuit configured to receive a first signal having an actual duty cycle and provide a corrected signal having a corrected duty cycle to the memory, including:

a self-biasing duty cycle detection circuit configured to identify a disparity between the corrected duty cycle and a target duty cycle and generate a control signal according to the disparity; and a signal adjustment circuit responsive to the control signal and configured to provide the corrected signal according to the target duty cycle.

2. A memory system according to claim 1, wherein the signal adjustment circuit comprises:

a first pulse width adjustment circuit responsive to the first signal and the control signal and configured to provide an initially adjusted signal; and a second pulse width adjustment circuit responsive to the initially adjusted signal and the control signal and configured to provide the corrected signal.

3. A memory system according to claim 2, wherein the duty cycle correction circuit further comprises a synchronizing circuit responsive to the initially adjusted signal and configured to provide a synchronized signal to the second pulse width adjustment circuit, wherein the synchronized signal is synchronized according to the initially adjusted signal.

4. A memory system according to claim 1, wherein the self-biasing duty cycle detection circuit comprise, a self-bias complementary circuit.

5. A memory system according to claim 4, wherein the self-biasing duty cycle detection circuit comprises a self-bias differential buffer.

6. A memory system according to claim 1, wherein the self-biasing duty cycle detection circuit composes:

two self-bias, complementary differential buffers configured to receive the corrected signal; and two capacitors connected to outputs of the two self-bias, complementary differential buffers.

7. A memory system according to claim 1, wherein the duty cycle correction circuit further comprises a bias generator configured to receive the control signal from the duty cycle detection circuit and generate a bias signal corresponding to the control signal, wherein the control signal includes a time-based signal corresponding to the disparity between the corrected duty cycle and the target duty cycle, and the bias signal includes a magnitude-based signal having a magnitude corresponding to the time-based signal.

8. A memory system, comprising:

a memory; and means for correcting an actual duty cycle of a first signal to approach a target duty cycle, including:

means for determining a difference between a corrected duty cycle of a corrected signal and the target duty cycle, wherein the difference determining means is self-biasing; and means for generating the corrected signal having the corrected duty cycle according to the difference.

9. A memory system according to claim 8, wherein the difference determining means comprises a self-bias complementary circuit.

10. A memory system according to claim 8, wherein the difference determining means comprises A self-bias differential buffer.

11. A memory system according to claim 8, wherein the difference determining means comprises:

two self-bias, complementary differential buffers configured to receive the corrected signal; and two capacitors connected to outputs of the two self-bias, complementary differential buffers.

12. A memory system according to claim 8, wherein the means for generating the corrected signal comprises:

first means for adjusting a pulse width responsive to the first signal and the means for determining the difference and configured to provide an initially adjusted signal having an initially adjusted pulse width; and second means for adjusting a pulse width responsive to the initially adjusted signal and the means for determining the difference and configured to provide the corrected signal.

13. A memory system according to claim 12, wherein the means for correcting the actual duty cycle of the first signal further comprises means for synchronizing a synchronized signal with the initially adjusted signal.

14. A method for correcting a duty cycle of a main signal, comprising:

transmitting the main signal with a first corrected duty cycle from one of a first signal adjustment circuit and a second signal adjustment circuit to a self-biasing buffer to determine a difference between the main signal duty cycle and a target duty cycle; and correcting the main signal duty cycle according to the difference to form the main signal with a second corrected duty cycle.

15. A method according to claim 14, further comprising:

transmitting to the self-biasing buffer from one of the first signal adjustment circuit and the second signal adjustment circuit a feedback signal representative of the main signal with the second corrected duty cycle.

16. A method according to claim 14, wherein correcting the main signal duty cycle comprises:

initially adjusting the duty cycle of the main signal according to the difference;

generating a synchronized signal synchronized to the initially adjusted main signal; and supplementally adjusting the synchronized signal according to the difference.

17. A method according to claim 14, wherein the self-biasing buffer is a self-biasing complementary buffer.

18. A method according to claim 14, wherein the self-biasing buffer is a self-biasing differential buffer.

19. A method according to claim 14, wherein the self-biasing buffer includes:

two self-bias, complementary differential buffers configured to receive the signal having the corrected main signal duty cycle; and two capacitors connected to outputs of the two self-bias, complementary differential buffers.

20. The method of claim 14, wherein providing the main signal with a corrected duty cycle to a self-biasing buffer comprises:

transmitting the main signal to the first signal adjustment circuit;

initially adjusting the duty cycle of the main signal with the first signal adjustment circuit;

transmitting the first adjusted main signal to a synchronization circuit;

generating a synchronized signal synchronized to the initially adjusted main signal;

transmitting the synchronized signal to the second signal adjustment circuit;

supplementally adjusting the synchronized signal with the second signal adjustment circuit to comprise the main signal with the first corrected duty cycle.

* * * * *